United States Patent
Borchert et al.

(10) Patent No.: US 6,699,778 B2
(45) Date of Patent: Mar. 2, 2004

(54) MASKING METHOD FOR PRODUCING SEMICONDUCTOR COMPONENTS, PARTICULARLY A BH LASER DIODE

(75) Inventors: Bernd Borchert, Moosburg (DE); Horst Baumeister, München (DE); Roland Gessner, Geretsried (DE); Eberhard Veuhoff, Ottobrunn (DE); Gundolf Wenger, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/052,950

(22) Filed: Jan. 18, 2002

(65) Prior Publication Data

US 2002/0182879 A1 Dec. 5, 2002

Related U.S. Application Data

(63) Continuation-in-part of application No. 09/867,290, filed on May 29, 2001, now Pat. No. 6,599,843, and a continuation of application No. PCT/DE01/02915, filed on Jul. 30, 2001.

(30) Foreign Application Priority Data

May 29, 2001 (DE) .......................... 101 27 580
Jul. 30, 2001 (WO) .............. PCT/DE01/02915

(51) Int. Cl.⁷ ...................... H01L 21/28; H01L 21/3205
(52) U.S. Cl. .................. 438/604; 438/738; 438/936
(58) Field of Search ................. 438/604, 717, 438/736, 738, 936

(56) References Cited

U.S. PATENT DOCUMENTS

| 4,595,454 A | | 6/1986 | Dautremont-Smith et al. | |
| 4,661,204 A | * | 4/1987 | Mathur et al. | 156/656 |
| 4,676,863 A | | 6/1987 | Furuyama et al. | |
| 4,816,115 A | * | 3/1989 | Horner et al. | 156/643 |
| 5,316,640 A | | 5/1994 | Wakabayashi et al. | |
| 5,372,675 A | | 12/1994 | Wakabayashi et al. | |
| 5,421,954 A | * | 6/1995 | Takado et al. | 156/635.1 |
| 5,866,435 A | | 2/1999 | Park | |

FOREIGN PATENT DOCUMENTS

| DE | 32 15 410 A1 | | 10/1983 | |
| DE | 3215410 | * | 10/1983 | C23F/1/04 |
| JP | 05 217 995 A | | 8/1993 | |

(List continued on next page.)

OTHER PUBLICATIONS

K. Imanaka et al.: „A novel technique to fabricate GaInAsP/InP buried heterostructure laser diodes, Appl. Phys. Lett. vol. 44, No. 10, May 15, 1984, pp. 975–977.

(List continued on next page.)

*Primary Examiner*—Caridad Everhart
(74) *Attorney, Agent, or Firm*—Laurence A. Greenberg; Werner H. Stemer; Gregory L. Mayback

(57) ABSTRACT

A method produces structures for semiconductor components, particularly BH laser diodes, in which a mask material is applied to a sample in a masking step. The etch rate in an etching step depends upon the composition and/or nature of the mask material. The etch rate is selected in such a way so that the mask is at least partly dissolved during the etching step. It is therefore possible to easily remove the mask from the semiconductor material and apply additional layers in situ during the fabrication of semiconductor components.

25 Claims, 3 Drawing Sheets

FOREIGN PATENT DOCUMENTS

| | | | | |
|---|---|---|---|---|
| JP | 05267276 A | * 10/1993 | ................. | 438/702 |
| JP | 05 299 764 | 11/1993 | | |
| JP | 06 342 777 | 12/1994 | | |
| JP | 06342777 A | * 12/1994 | ......... | H01L/21/302 |
| JP | 09213709 A | * 9/1997 | ......... | H01L/21/331 |

OTHER PUBLICATIONS

J.R. Lothian et al.: "Mask erosion during dry etching of deep features in III–V semiconductor structures", Semiconductor Science and Technology, vol. 7, No. 9, Sep. 1992, pp. 1199–1209.

P. Wolfram et al.: "MOVPE–based in situ etching of In(GaAs)P/InP using tertiarybutylchloride", Journal of Crystal Growth, No. 221, 2000, pp. 177–182.

R. Gessner et al.: "In–Situ Etching of InP Based BH Laser Structures in MOVPE", 2001 International Conference on Indium Phosphide and Related Materials Conference Proceedings, 13$^{th}$ IPRM, May 14–18, 2001, Nara, Japan, pp. 398–399.

* cited by examiner

MASKING METHOD FOR PRODUCING SEMICONDUCTOR COMPONENTS, PARTICULARLY A BH LASER DIODE

CROSS-REFERENCE TO RELATED APPLICATIONS

This application is a continuation-in-part of U.S. application Ser. No. 09/867,290, filed May 29, 2001, now U.S. Pat. No. 6,599,843 and a continuation of copending International Application No. PCT/DE01/02915, filed Jul. 30, 2001, which designated the United States.

BACKGROUND OF THE INVENTION 2

Field of the Invention

The invention relates to masking techniques for producing semiconductor components, particularly a BH laser diode. In the production of III–V semiconductor components, masking steps are usually used to structure the surface of a sample. The surface of the sample is partially covered with a mask, for instance a mask made of $SiO_2$ as an amorphous material. The sample material is then removed in the region that is not covered by the mask by an etching step (a dry or wet chemical process).

The term "sample" refers to any material that is structured in the course of manufacturing semiconductor components.

For instance, a BH (Buried Heterostructure) laser diode includes a structured active layer, with dry etching techniques (e.g. reactive ion etching) and/or wet chemical techniques being used for structuring.

The disadvantage of this procedure is that, in order to remove the $SiO_2$ mask from the surface or to structure the active layer of the BH laser diode, the sample must be removed from the epitaxy apparatus, thereby exposing the sample to air-borne contaminants and oxygen. The contamination is particularly bad in structures containing aluminum, because this exhibits a high bonding affinity to oxygen. Because such structures are highly significant to semiconductor laser production, the contamination in ex-situ techniques is particularly problematic.

It is also necessary to add an expensive wet chemical treatment process to dry etching techniques for BH laser diode fabrication, in order to remove the regions of the semiconductor material where ex-situ damage occurs. In a InGaAsP/InP system, etching solutions containing bromine are usually used, which may adversely affect the long-term stability of the BH laser diodes.

Furthermore, in the selective epitaxy technique used in BH laser diode fabrication, it is impossible to prevent the mask material, for instance $SiO_2$ or SiN, from getting into the epitaxy apparatus. At high temperatures, there is a chance that this mask material may additionally contaminate the wafer.

SUMMARY OF THE INVENTION

It is accordingly an object of the invention to provide a masking method for producing semiconductor components, particularly a BH laser diode, that overcomes the hereinafore-mentioned disadvantages of the heretofore-known devices of this general type and that provides a method for easily removing the mask from semiconductor material and applying additional layers in situ during the manufacture of semiconductor components.

With the foregoing and other objects in view, there is provided, in accordance with the invention, a method of producing a structure for semiconductor components. The first step of the method is applying a mask made of at least one mask material to a sample in a masking step. The next step is selecting the composition of the mask material to control the etch rate. The next step is at least partially etching the mask during an etching step.

In accordance with a further object of the invention, the etching step lasts for a set period of time.

The mask can be at least partly dissolved during an etching step by selecting the etch rate in the etching step based upon the composition and/or nature of the mask material. Thus, a masking and further processing of the sample can be performed in-situ in the epitaxy apparatus. In this way, a kind of self-dissolving mask can be created, given which the etch rate is expediently selected in such a way that the mask is gone from the sample at the end of the etching step, or the underlying layer is etched.

It is particularly advantageous to utilize a III–V semiconductor material, namely a monocrystalline III–V semiconductor material.

It is also advantageous if at least one mask material is $Ga_xIn_{1-y}As_yP_{1-y}$, AlGaInAs, or InGaAlP. These materials can be is removed in a highly controlled fashion by etching the sample.

It is particularly advantageous if the creation of a structure on and/or in the mask, specifically by lithography, is followed by an etching step with tertiary butyl chloride (TBCl) as the etching agent. This etching agent is appreciably milder than the halogenic hydrogen compounds (e.g. HCl) commonly used in in-situ methods. Thus, noble steel parts, for instance parts of the epitaxy apparatus, valves, or pipes, are not attacked. Moreover, the etch rate of this agent is particularly easy to control. In this way, a "self-etching mask" can be created, which is removable from the sample in-situ. The mask can be at least partly dissolved during etching, which saves a substantial amount of processing time.

It is advantageous that the etching step can be accomplished in the same device in which the structure has been applied in and/or on the sample.

Advantageously, at least one epitaxial layer, particularly a guard layer, is applied to the surface in situ after the etching step. The in-situ overgrowth prevents contamination and saves valuable processing time.

The doping type of the overgrowth layers is expediently complementary to the doping type of a substrate for the semiconductor component. It is also advantageous if the band gap to at least one overgrowth layer is larger than the band gap of the active layer of the semiconductor component.

In an advantageous development of the inventive method, at least one surface-wide etching of a ridge for a BH laser diode is completed in situ in the epitaxy device during the etching step. This way, a significant production step can be accomplished in situ.

Upon completion of the method, the emerging semiconductor structure can be expediently applied in a semiconductor component, particularly a BH laser.

In a particularly efficient production of a BH laser diode, an etching step with TBCl serves specifically for creating the ridge structure, and a subsequent epitaxy step is completed for the overgrowth. The etching step and the overgrowth step are accomplished in situ in the same epitaxy device (without the sample leaving the epitaxy device), so that the production process is particularly efficient and free of contamination.

An epitaxy step for generating a base structure can be expediently provided before the etching step.

Other features that are considered as characteristic for the invention are set forth in the appended claims.

Although the invention is illustrated and described herein as embodied in a masking technique for producing semiconductor components, particularly a BH laser diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
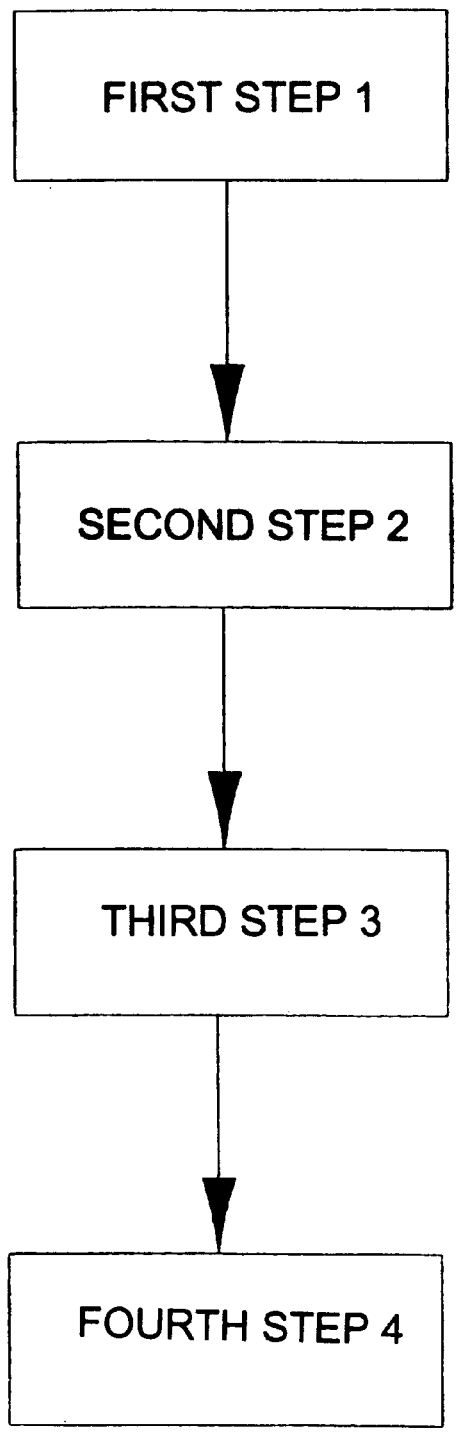
FIG. 1. is a flowchart of an embodiment of the inventive method.

Referring now to the figures of the drawings in detail and first, particularly to FIG. 1 thereof, there is shown the steps that are essential to laying out the invention. Many of the steps in the production of semiconductor components by epitaxy and masking are known. The substrate with the layer structure of the semiconductor component is referred to as a sample. The mask is disposed over the layer system.

In the first step 1, a component base structure is applied to a wafer by epitaxy. The mask material is also epitaxially applied. This is $Ga_xIn_{1-y}As_yP_{1-y}$ in this embodiment. Alternatively, AlGaInAs can be utilized as the III–V semiconductor material. In any case, it is also possible to utilize other mask materials such as Si or $SiO_2$, which are inventively at least partly dissolved in situ. If the mask material is a pure element (e.g. Si), the crystal structure or some other material properties can be purposefully selected to produce the controlled in-situ dissolving effect.

In this context, epitaxy refers to the deposition of layers on substrates, which may be amorphous, polycrystalline or monocrystalline. Thus, in principle any deposition method (chemical or physical) is included.

In the second step 2, the surface of the sample and mask is structured ex situ by a known technique such as lithography.

In the third step 3, the etching step, a structure on and/or in the sample is etched in the epitaxy apparatus. Tertiary butyl chloride (2-Cl-2-methylpropane; TBCl) is used as the etching gas. TBCl is less chemically aggressive than the customary etching gasses such as those that are hydrochloric-acid based. In any case, the choice of etching gas may also depend on the masking material that is used, so that hydrochloric acid can in fact be utilized given another material such as Si.

Surprisingly, the etch rate of TBCl in the mask material $Ga_xIn_{1-y}As_yP_{1-y}$ is dependent on the composition of the mask material, i.e. on x and y. This will be described more closely in connection with FIG. 2.

In the present case, the composition of the mask material is selected such that by the end of the etching step 3 the mask material is gone from the sample. Alternatively, the mask material can be removed up to a predeterminable amount, or etching can proceed into the underlying layer.

Because this etching is performed in situ in the epitaxy apparatus, contamination of the surface is avoided, and valuable processing time is saved.

Next, in a fourth step 4, additional layers are grown over, particularly epitaxial guard layers. This is particularly advantageous given sample materials containing aluminum, because these are particularly sensitive to contamination.

Upon completion of the inventive method, the created semiconductor structure can be utilized in a semiconductor laser.

Figure 2:
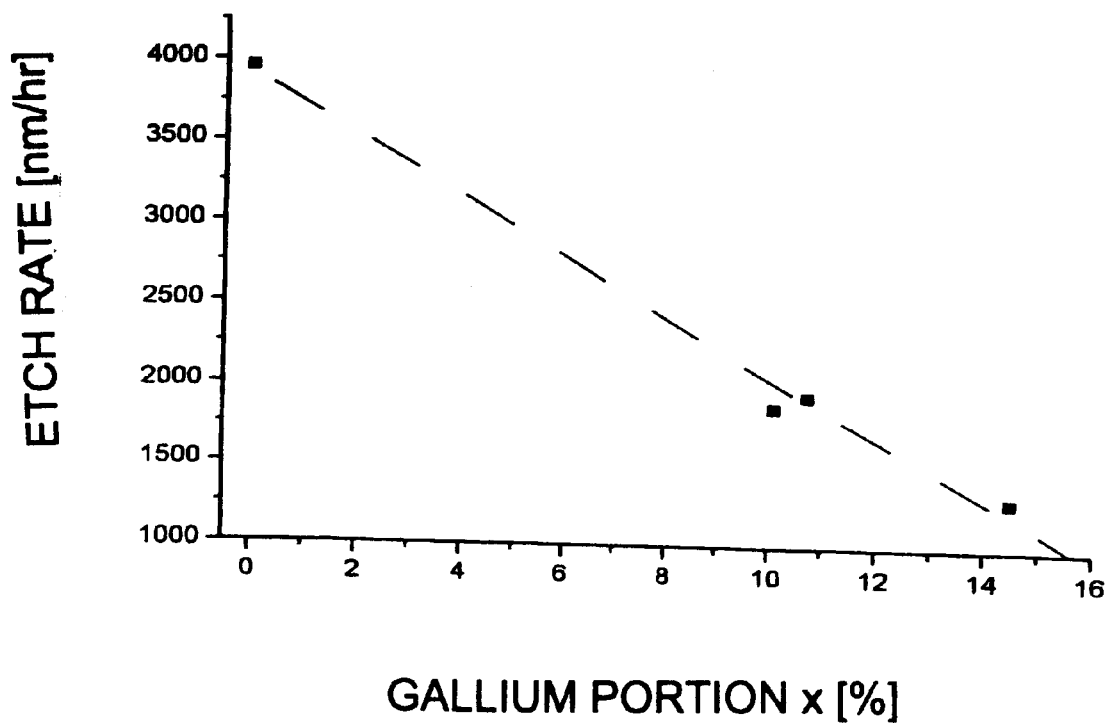
FIG. 2 is a graph plotting each rate versus the composition of the mask material.

FIG. 2 represents measurement values in which the dependency of the etch rate in nanometers per hour(nm/hr) is plotted on the ordinate. The percentage of gallium (x) in the mask material $Ga_xIn_{1-y}As_yP_{1-y}$ is plotted on the abscissa. The measurement values were obtained at a temperature of 580° C. given a TBCl flow of $8.2\times10^{-5}$ mol/min (without $PH_3$). The hydrogen carrier gas flow amounted to 16 1/min.

It can be recognized in FIG. 2 that a high etch rate is achieved given a low gallium portion. A gallium portion of 10% halves the etch rate. An increase to 15% halves this value again. Thus, the etch rate is approximately linearly related to the gallium proportion.

With the aid of a functional dependency such as this, the etch rate can be set such that a mask of predetermined thickness is completely removed from the sample at the conclusion of the etching process. If the etch rate is prescribed, the thickness of the mask material can be set to achieve the same aim.

Figure 3C:
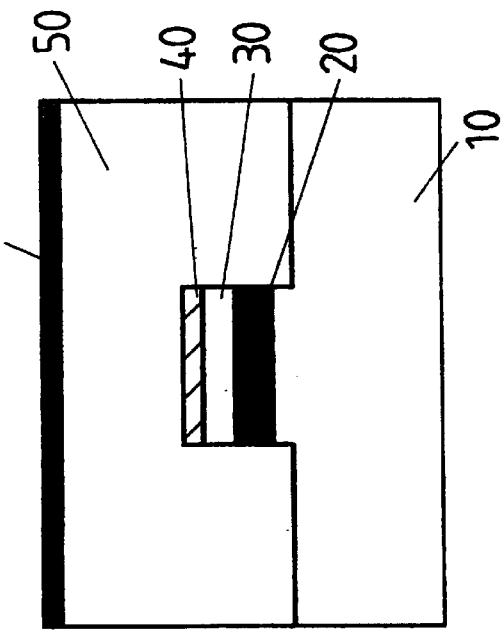
FIG. 3c is a sectional view of a third production step for a BH laser diode.
Figure 3A:
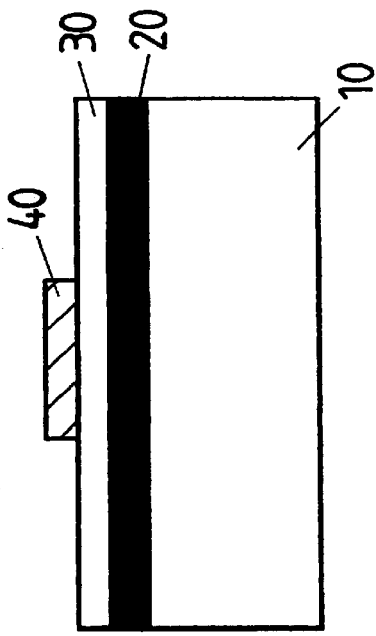
FIG. 3a is a sectional view of a first production step for a BH laser diode.
Figure 3B:
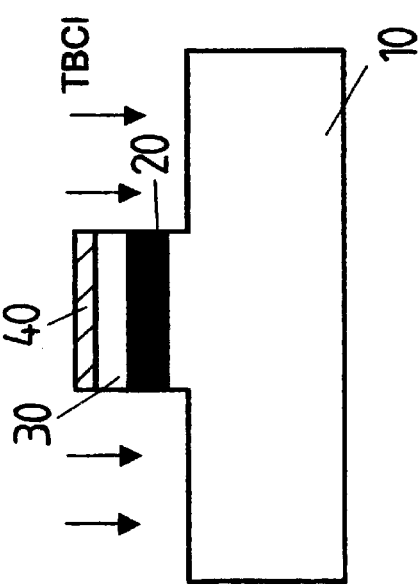
FIG. 3b is a sectional view of a second production step for a BH laser diode.

The inventive method will now be more closely described in connection with FIGS. 3a to 3c with reference to the fabrication of a BH laser diode. FIG. 3a represents the first structuring as the first step of production. FIG. 3b represents the etching step 3 with TBCl, while FIG. 3c represents the surface-wide epitaxial overgrowth process.

The BH laser diode is built on an n-doped InP substrate 10. Over this, an active layer 20 is disposed, which is covered by a p-doped InGaAsP(2) layer 30. P-doped InGaAsP(1) serves as the mask 40.

In the second production step (FIG. 3b), gaseous TBCl is utilized for in-situ etching. This is symbolized by the vertical arrows. This creates the ridge of the BH laser, since the p-InGaAsP(2) layer 30 and the active layer 20 are etched down to the substrate 10 in the non-masked region. The thickness of the mask 40 is somewhat reduced by the etching with TBCl. As described above, in alternative embodiments, the thickness of the mask 40 can also be set such that the mask 40 is completely gone following the etching with TBCl.

Next, in the third production step (FIG. 3c) the BH laser structure is likewise provided in situ with a p-doped coverlayer 50 and a contact layer 60.

Alternatively, the (In)GaAlAs/GaAS, InGaAlP/GaAs or InGaAlP/InP material systems can also be utilized. Alternatively, the doping of the layers can be reversed; i.e., an n-doped InP substrate 10 can be utilized.

The invention is not limited in its embodiment to the foregoing preferred exemplifying embodiments. Rather, any number of variations are also imaginable, which employ the inventive method and the inventive device in fundamentally different embodiments.

We claim:

1. A method of producing a structure for semiconductor components, which comprises:
   applying a mask made of a mask material including a III–V semiconductor material to a sample in a masking step;
   at least partially etching the mask during an etching step; and
   selecting a composition of the mask material to control the etch rate to cause the mask to be removed from the sample when the etching step ends.

2. The method according to claim 1, wherein the etching step lasts for a set period of time.

3. The method according to claim 1, wherein the selecting of the composition creates an etch rate causing the etching to proceed into a layer underlying the mask when the etching step ends.

4. The method according to claim 1, wherein the III–V semiconductor material is monocrystalline.

5. The method according to claim 1, which further comprises using $Ga_xIn_{1-y}As_yP_{1-y}$ as at least one of the mask materials.

6. The method according to claim 1, which further comprises using AlGaInAs as at least one of the mask materials.

7. The method according to claim 1, which further comprises, before the etching step, creating a structure on the mask.

8. The method according to claim 7, wherein the step of creating of the structure is performed by lithographing the mask.

9. The method according to claim 7, which further comprises;
   using an apparatus for creating the structure on the sample; and
   using the same apparatus for performing the etching step.

10. The method according to claim 1, which further comprises, after the etching step, applying the sample in a semiconductor component.

11. The method according to claim 10, wherein the sample is a BH laser diode,

12. The method according to claim 1, wherein the method is used for producing BH laser diodes.

13. A method of producing a structure for semiconductor components, which comprises:
    applying a mask made of at least one mask material to a sample in a masking step;
    selecting a composition of the mask material to control the etch rate;
    creating a structure on the mask; and
    at least partially etching the mask using tertiary butyl chloride as an etching agent during an etching step.

14. The method according to claim 1, which further comprises, before the etching, creating a structure in the mask.

15. The method according to claim 14, wherein the step of creating of the structure includes lithographing the mask.

16. The method according to claim 14, which further comprises:
    using an apparatus for creating the structure in the sample; and
    using the same apparatus for performing the etching step.

17. A method of producing a structure for semiconductor components, which comprises:
    applying a mask made of at least one mask material to a sample in a masking step;
    selecting a composition of the mask material to control the etch rate;
    creating a structure in the mask; and
    at least partially etching the mask using tertiary butyl chloride as an etching agent during an etching step.

18. A method of producing a structure for semiconductor components, which comprises:
    applying a mask made of at least one mask material to a sample in a masking step;
    selecting a composition of the mask material to control the etch rate;
    at least partially etching the mask during an etching step; and
    applying an epitaxial layer to a surface of the sample in situ after the etching step.

19. The method according to claim 18, wherein the epitaxial layer is a guard layer.

20. The method according to claim 18, which further comprises doping the epitaxial layer to complement a doping type of a substrate to be added to the sample.

21. The method according to claim 18, wherein the sample has an active layer, and a first band gap to the epitaxial layer is larger than a second band gap of the active layer.

22. The method according to claim 18, wherein:
    the applying of the epitaxial layer is performed in an eptiaxy apparatus; and
    the etching step includes performing at least one surface-wide etching of a ridge for a BH laser diode in situ in the epitaxy apparatus.

23. The method according to claim 18, which further comprises forming a BH laser diode by performing both the etching step and applying the epitaxy layer in situ in an epitaxy apparatus.

24. The method according to claim 23, wherein the etching step forms a step for creating a ridge structure.

25. The method according to claim 23, which further comprises creating a base structure with an epitaxy step before the etching step.

* * * * *